US012716933B2

(12) United States Patent
Yu et al.

(10) Patent No.: US 12,716,933 B2
(45) Date of Patent: Aug. 25, 2026

(54) METHOD FOR TESTING TOTAL DOSE EFFECT OF SiC MOSFET DEVICE

(71) Applicant: CHINA ACADEMY OF SPACE TECHNOLOGY, Beijing (CN)

(72) Inventors: Qingkui Yu, Beijing (CN); He Wang, Beijing (CN); Shuang Cao, Beijing (CN); Yi Sun, Beijing (CN); Bo Mei, Beijing (CN); He Lv, Beijing (CN); Rigen Mo, Beijing (CN); Qianyuan Wang, Beijing (CN); Jiajia Sun, Beijing (CN); Hongwei Zhang, Beijing (CN)

(73) Assignee: CHINA ACADEMY OF SPACE TECHNOLOGY, Beijing (CN)

( * ) Notice: Subject to any disclaimer, the term of this patent is extended or adjusted under 35 U.S.C. 154(b) by 154 days.

(21) Appl. No.: 18/712,623

(22) PCT Filed: Nov. 4, 2022

(86) PCT No.: PCT/CN2022/129934
§ 371 (c)(1),
(2) Date: May 22, 2024

(87) PCT Pub. No.: WO2023/093499
PCT Pub. Date: Jun. 1, 2023

(65) Prior Publication Data

US 2025/0012846 A1 Jan. 9, 2025

(30) Foreign Application Priority Data

Nov. 23, 2021 (CN) ......................... 202111394943.3

(51) Int. Cl.
*G01R 31/26* (2020.01)

(52) U.S. Cl.
CPC ..... *G01R 31/2621* (2013.01); *G01R 31/2648* (2013.01)

(58) Field of Classification Search
CPC ............ G01R 31/2621; G01R 31/2648; G01R 31/2642; G01R 31/26; Y02B 70/10
See application file for complete search history.

(56) References Cited

U.S. PATENT DOCUMENTS 4,816,753 A 3/1989 Palkuti
6,476,597 B1 * 11/2002 Spratt .................. G01R 31/001 324/762.01

(Continued)

FOREIGN PATENT DOCUMENTS

CN 108037438 A 5/2018
CN 111693838 A * 9/2020 ......... G01R 31/2601

(Continued)

OTHER PUBLICATIONS

International Search Report of the ISA, issued in PCT/CN2022/129934, mailed Feb. 7, 2023; ISA/CN.

*Primary Examiner* — Akm Zakaria
(74) *Attorney, Agent, or Firm* — Harness, Dickey & Pierce, P.L.C.

(57) ABSTRACT

A method for testing the total dose effect of a SiC MOSFET device, realizing verification of the complex total dose effect of the SiC MOSFET. The test steps sequentially comprise: testing a tested device before irradiation; performing annealing treatment on the tested device before irradiation; performing an irradiation test on the tested device; performing annealing treatment on the tested device after irradiation; performing test data analysis and processing on the tested device after irradiation. In the test process, threshold voltage shift caused by total dose radiation-induced defects and threshold voltage shift caused by near interface trap charges inherent near a SiC MOSFET interface are measured respec- (Continued)

tively, comprehensive analysis and calculation are carried out on the test result, the total dose effect resistance capability of the SiC MOSFET device can be given, and a certain guiding effect on device reinforcement is achieved.

15 Claims, 2 Drawing Sheets

(56) References Cited

U.S. PATENT DOCUMENTS

| | | | | |
|---|---|---|---|---|
| 10,718,872 | B2 * | 7/2020 | Tosh | G01T 1/026 |
| 2022/0128712 | A1 * | 4/2022 | Tudisco | H10F 71/1215 |

FOREIGN PATENT DOCUMENTS

| | | | |
|---|---|---|---|
| CN | 111812481 | A | 10/2020 |
| CN | 113358991 | A | 9/2021 |
| CN | 114460429 | A | 5/2022 |
| RU | 2375719 | C1 | 12/2009 |
| RU | 2015102951 | A | 8/2016 |

* cited by examiner 0.5
0
-0.5
-1
-1.5
-2
ΔVth/V
T=100C
T=150C
0
50
100
150
Annealing time/h

METHOD FOR TESTING TOTAL DOSE EFFECT OF SiC MOSFET DEVICE

This application is the national phase of International Application No. PCT/CN2022/129934, titled "METHOD FOR TESTING TOTAL DOSE EFFECT OF SIC MOSFET DEVICE", filed on Nov. 4, 2022, which claims priority to Chinese Patent Application No. 202111394943.3, titled "METHOD FOR TESTING SIC MOSFET DEVICE BASED ON TOTAL IONIZING DOSE EFFECT", filed on Nov. 23, 2021 with the China National Intellectual Property Administration, which are incorporated herein by reference in their entirety.

FIELD

The present disclosure relates to a method for testing a silicon carbide (SiC) metal-oxide-semiconductor field-effect transistor (MOSFET) device based on a total ionizing dose effect, which belongs to the technical field of anti-radiation of space-used electric components.

BACKGROUND

A spacecraft operating in space environment suffers from space radiation, and is subject to the total ionizing dose effect. Hence, components within the spacecraft shall be evaluated under the total ionizing dose effect.

Silicon carbide (SiC) metal-oxide-semiconductor field-effect transistors (MOSFETs) are third-generation semiconductor devices which are similar to silicon (Si) MOSFETs, because they both have gate oxide layers made of $SiO_2$ and are subject to the total ionizing dose effect in which trapped charges are generated in the oxide layer due to radiation. The SiC MOSFETs and the Si MOSFETs differ from each other in that the $SiO_2$ gate oxide layer in the Si MOSFET is formed through oxidizing Si, while the $SiO_2$ gate oxide layer in the SiC MOSFET is formed through oxidizing SiC. In the latter oxidization, C or CO is released, and a structure and characteristics of the formed $SiO_2$/SiC interface are quite different from those of a $SiO_2$/Si interface. Hence, the total ionizing dose effects are different, the failure mechanisms of devices under radiation are different. Therefore, conventional radiation testing methods established based on a radiation effect on the Si MOSFETs are not thoroughly applicable to the SiC devices. It is necessary to establish a test method based on the radiation effect on the SiC MOSFETs, so as to evaluate anti-radiation level of the SiC MOSFETs. Thus, a method for testing a SiC MOSFET device based on its mechanism of total ionizing dose effect should be provided to address such issue.

SUMMARY

An objective of the present disclosure is testing a silicon carbide (SIC) metal-oxide-semiconductor field-effect transistor (MOSFET) device for its anti-radiation level of total ionizing dose. A SIC MOSFET device may be subjected to pre-irradiation annealing, irradiation, and post-irradiation annealing. Testing data obtained before the pre-irradiation annealing, after the pre-irradiation annealing, after the irradiation, and after the post-irradiation annealing are analyzed and processed to generate data to evaluate the anti-radiation level of the SiC MOSFET.

The above objective of the present disclosure is achieved mainly through following technical solutions.

A method for testing a SiC MOSFET device based on a total ionizing dose effect is provided, comprising: step (1), performing pre-irradiation annealing on a group of SiC MOSFET devices in a batch of SiC MOSFET devices, where the group of SiC MOSFET devices are qualified in a test on an electrical parameter, the pre-irradiation annealing comprises high temperature annealing under a positive gate bias and high temperature annealing under a negative gate bias, and threshold voltages of each SiC MOSFET device in the group before and after the high temperature annealing under the positive gate bias and before and after the high temperature annealing under the negative gate bias are acquired to determine a shift criterion for post-irradiation threshold voltage of the batch; step (2), performing irradiation on another group of SiC MOSFET devices in the batch until a total ionizing dose of the irradiation reaches a target dose, where the another group of SiC MOSFET devices are qualified in the test on the electrical parameter, a threshold voltage of each SiC MOSFET device in the another group after the irradiation are obtained as test data; determining whether the test data meets a criterion for qualifying the post-irradiation threshold voltage; performing step (3) in response to the test data meeting the criterion; and in response the test data not meeting the criterion, performing post-irradiation annealing at room temperature on the another group of SiC MOSFET devices, where a threshold voltage of each SiC MOSFET device in the another group after the post-irradiation annealing is obtained as new test data, and determining whether the new test data meets the criterion, performing the step (3) in response to the new test data meeting the criterion, and determining that the batch fails a test of the total ionizing dose effect in response to the new test data not meeting the criterion; and step (3), performing high-temperature annealing on another group of SiC MOSFET devices, where another threshold voltage of each SiC MOSFET device in the another group after the high-temperature annealing is obtained; determining whether the another threshold voltage meets the criterion; determining that the batch passes the test of the total ionizing dose effect in response to the another threshold voltage meeting the criterion; and determining that the batch fails the test of the total ionizing dose effect in response to the another threshold voltage not meeting the criterion.

In an embodiment, the high temperature annealing under the positive gate bias and the high temperature annealing under the negative gate bias comprises: annealing the group of SiC MOSFET devices under temperature T ranging from 100° C. to 200° C. while applying a maximum positive gate-to-source voltage corresponding to specifications of the group of SiC MOSFET devices for a period ranging from 24 hours to 168 hours, and then cooling the group of SiC MOSFET devices to the room temperature to obtain a threshold voltage $Vth_{high\ temperature\ annealing\ under\ positive\ gate\ bias}$ of the group device after the high temperature annealing under the positive gate bias through the test on the electrical parameter; and then annealing the group of SiC MOSFET devices under another temperature T ranging from 100° C. to 200° C. while applying a maximum negative gate-to-source voltage corresponding to the specifications of the group of SiC MOSFET devices for another period ranging from 24 hours to 168 hours, and then cooling the group of SiC MOSFET devices to the room temperature to obtain a threshold voltage $Vth_{high\ temperature\ annealing\ under\ negative\ gate\ bias}$ of the group after the high temperature annealing under the negative gate bias through the test on the electrical parameter.

In an embodiment, the pre-irradiation annealing comprises: annealing the group of SiC MOSFET devices under the temperature T equal to 150° C. while applying the maximum positive gate-to-source voltage corresponding to specifications of the group of SiC MOSFET devices for the period equal to 48 h, and then cooling the group of SiC MOSFET devices to the room temperature to obtain the threshold voltage $Vth_{high\ temperature\ annealing\ under\ positive\ gate\ bias}$ of the group after the high temperature annealing under the positive gate bias through the test on the electrical parameter; and then annealing the group of SiC MOSFET devices under the another temperature T equal to 150° C. while applying the maximum negative gate-to-source voltage corresponding to the specifications of the group of SiC MOSFET devices for the another period equal to 48 h, and then cooling the group of SiC MOSFET devices to the room temperature to obtain the threshold voltage $Vth_{high\ temperature\ annealing\ under\ negative\ gate\ bias}$ of the group after the high temperature annealing under the negative gate bias through the test on the electrical parameter.

In an embodiment, the criterion is determined through: calculating a variation $\Delta Vth_{high\ temperature\ annealing}$ of threshold voltages between the high temperature annealing under the positive gate bias and the high temperature annealing under the negative gate bias through $\Delta Vth_{high\ temperature\ annealing} = Vth_{high\ temperature\ annealing\ under\ positive\ gate\ bias} - Vth_{high\ temperature\ annealing}$ under negative gate bias, wherein $Vth_{high\ temperature\ annealing\ under\ negative\ gate\ bias}$ and $Vth_{high\ temperature\ annealing}$ under positive gate bias are the threshold voltages after the high temperature annealing under the positive gate bias and the high temperature annealing under the negative gate bias, respectively in test data acquired in the step (1); and determining the criterion to be $Vthmin + \Delta Vth_{high\ temperature\ annealing} < Vth < Vthmax - \Delta Vth_{high\ temperature\ annealing}$, where $Vthmin + \Delta Vth_{high\ temperature\ annealing}$ and $Vthmax - \Delta Vt_{high\ temperature\ annealing}$ are the minimum and a maximum value of threshold voltages criterion, Vthmin and Vthmax are a minimum and a maximum, respectively, of a qualified threshold voltage corresponding to the specifications of the group of SiC MOSFET devices, and Vth is test data which is to be compared with the criterion.

In an embodiment, temperature of the high-temperature annealing in the step (3) ranges from 125° C. to 175° C.

In an embodiment, temperature of the high-temperature annealing in the step (3) is equal to 150° C.

Technical solutions of the present disclosure are technically advantageous over the conventional technology in follows aspects.

The technical solutions are designed and developed for the total ionizing dose effect of SiC MOSFETs, and can meet special requirements in the test based on the total ionizing dose effect.

The SiC MOSFETs are third-generation semiconductor devices, and are similar to Si MOSFETs since they both comprise gate of $SiO_2$. Researches have revealed that a density of near-interface traps (NITs) is high in the SiC MOSFETs. The NITs are generated during a manufacturing process. It is discovered that the NITs introduce a shift of the threshold voltage under high temperature and high voltage stress, and such shift due to the NITs and a shift of the threshold voltage due to radiation have independent influences on degradation of device performances. In a worst case, a total shift of the threshold voltage in a device is a sum of the shift due to the NITs and the shift due to the radiation, as shown in FIGS. 2 and 3.

Therefore, the method provided according embodiments of the present disclosure considers not only the shift of the threshold voltage due to radiation but also the shift of the threshold voltage shift due the NITs. It is discovered that the shift due to the NITs is a function of temperature. The shift of the threshold voltage increases as the temperature increases within a temperature range from 25° C. to 150° C., and decreases when the temperature rises higher. Experiment data are shown in following Table 1. Generally, a maximum operating junction temperature of a device is 150° C., and hence optimal temperature for a test under high temperature annealing and a biased gate is selected to be 150° C. with comprehensive considerations.

TABLE 1

| Annealing | shift of threshold voltage (V) | |
|---|---|---|
| Temperature (° C.) | SiC MOSFET from manufacture A | SiC MOSFET from manufacture B |
| 25 | 0.25 | 0.3 |
| 100 | 0.40 | 0.63 |
| 150 | 0.50 | 0.65 |
| 175 | 0.46 | 0.64 |

Interface states generated due to radiation introduces the shift of the threshold voltage shift. High-temperature degradation experiment can accelerate the generation of the interface states. Conventional Si MOSFETs are subject to fast annealing under temperature of 100° C. to accelerate the generation of the interface states and render annealing of trapped charges in an oxide layer more complete, such that a maximum rightward shift of the threshold voltage can be evaluated conveniently. A bandgap width of SiC is 3.26 eV, which is approximately three times that of Si (of which a bandgap width is 1.1 eV). Theoretically, higher annealing temperature would achieve a better effect for the SiC MOSFETs, which are wide bandgap semiconductor devices. Researches reveal that an effect of high-temperature annealing under 150° C. is more outstanding than that of high-temperature annealing under 100° C., as shown in FIG. 4. Therefore, temperature for degradation is altered to be 150° C. according to embodiments of the present disclosure.

DETAILED DESCRIPTION OF EMBODIMENTS

Hereinafter the present disclosure is further described in detail below in conjunction with the drawings.

Figure 1:
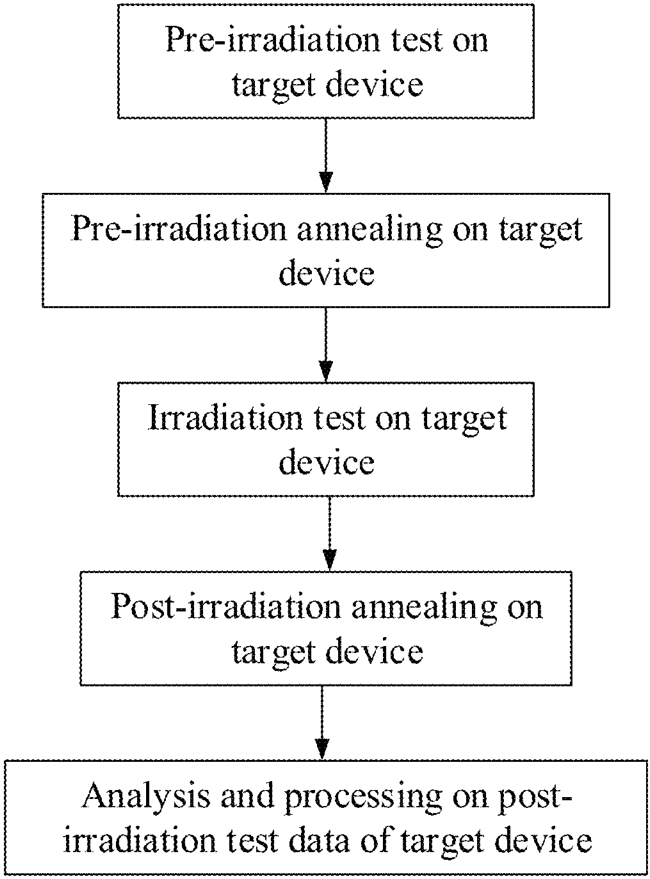
FIG. 1 is a flow chart of a method according to an embodiment of the present disclosure.
Figure 2:
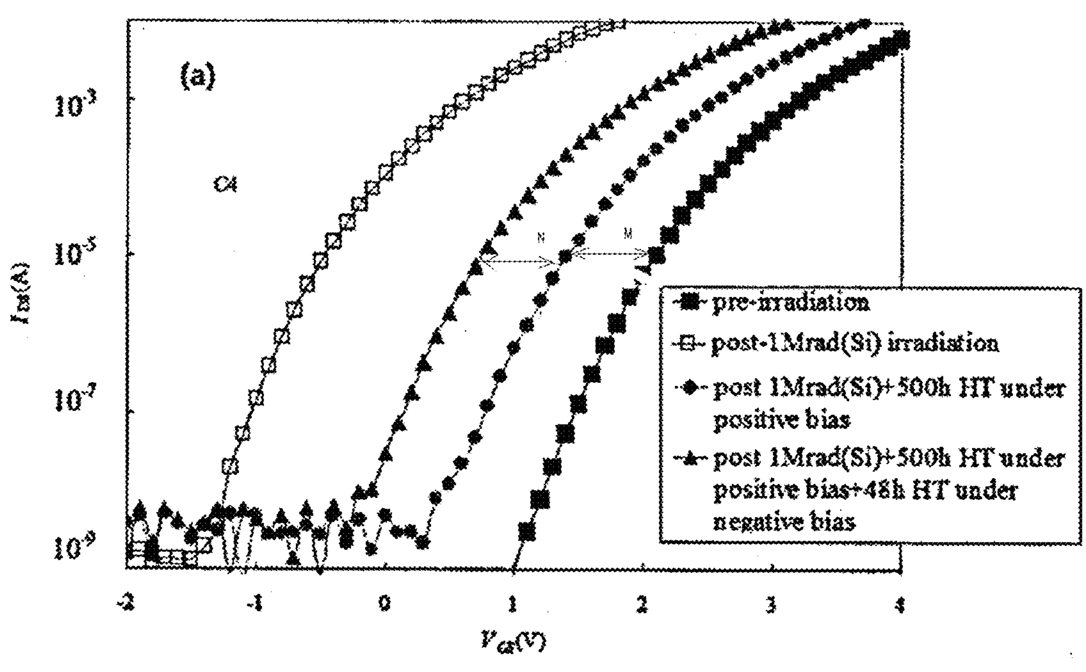
FIG. 2 and FIG. 3 show a shift of a threshold voltage under radiation and annealing, where M indicates a shift due to radiation and annealing, according to an embodiment of the present disclosure.
Figures 3, 4:
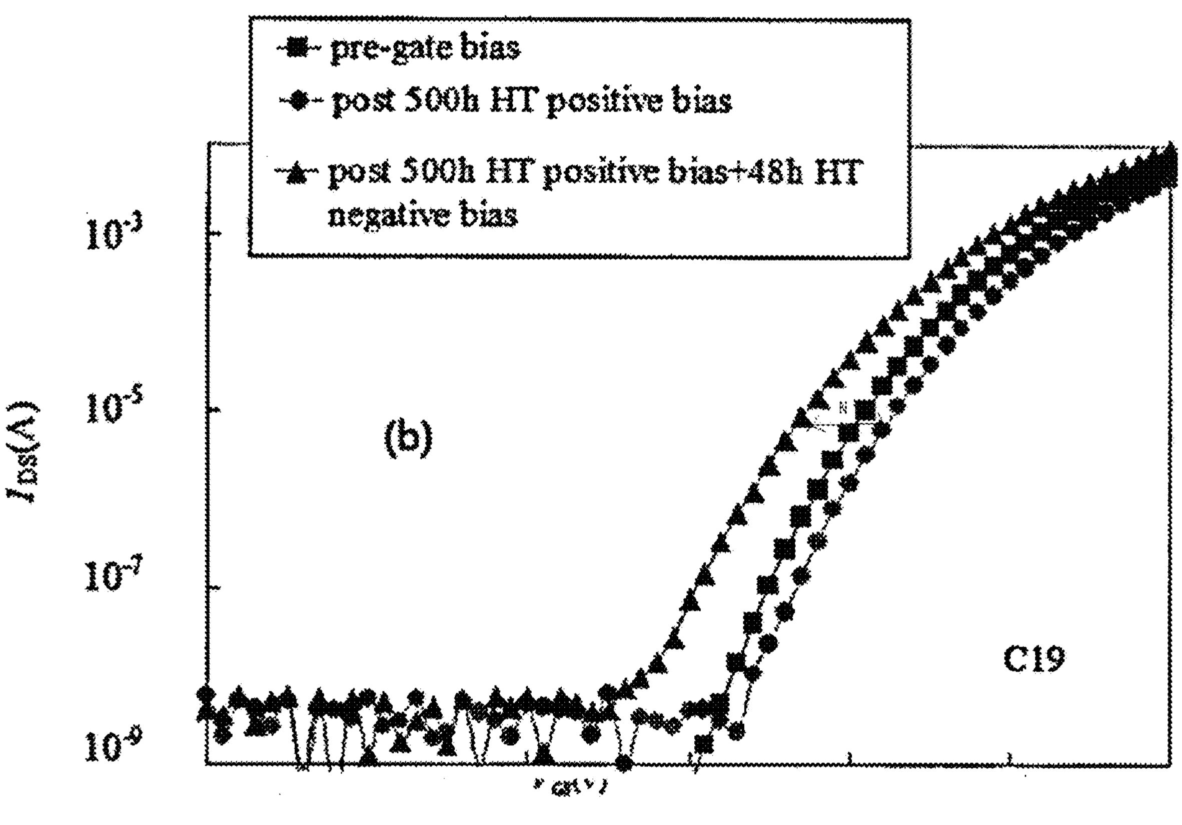
FIG. 4 shows comparison of shifts of a threshold voltage under high temperature annealing of 100° C. and 150° C. according to an embodiment of the present disclosure.

FIG. 1 shows a method for testing a silicon carbide (SIC) metal-oxide-semiconductor field-effect transistor (MOSFET) device based on a total ionizing dose effect. The method comprises a pre-irradiation test, two pre-irradiation high temperature annealing tests, an irradiation test, and a post-irradiation annealing, which are performed on target device(s). The method further comprises analysis and processing of data of the tests on the target device(s).

(1) Pre-Irradiation Test of Target Devices

Electrical parameter(s) of the target device(s) are tested according to a condition specified in product specification, and a result of the test is recorded. Only a device having qualified electrical parameters can be tested in subsequent tests.

(2) Pre-Irradiation Annealing of Target Devices

A $SiC/SiO_2$ interface in the SiC MOSFETs is much more complicated than a $Si/SiO_2$ interface in Si MOSFETs, and the total ionizing dose effect in the former is also more complicated than that in the latter. Not only defects introduced by radiation in a gate oxide layer would introduce a change in device performances, but also inherent defects in a device would be changed under stress. Conventional manners of irradiation tests are developed based on a radiation effect of silicon devices, and cannot evaluate radiation-introduced degradation of performances of SiC devices with satisfactory accuracy. Herein a condition of two pre-irradiation high temperature annealing tests is configured for the target device(s) according to unique characteristics of the inherent defects in the SiC MOSFETs and a rule governing a radiation effect of the SiC MOSFETs. Thereby, an impact of the inherent defects in the SiC MOSFETs can be quantitatively tested, which is a key step in a test for evaluating an anti-radiation level of SiC MOSFET.

A) Temperature in a test chamber is adjusted to 150° C. The target device(s) are mounted on a test board. The test board is placed in the test chamber, and a maximum positive gate-to-source voltage, which is specified in the product specifications, is applied to the target device(s) on the test board, so as to conduct a test of high temperature annealing under bias for 48 hours. After the 48 hours, the temperature in the test chamber is lowered to room temperature, and the voltage on the target device(s) is removed. The target device(s) are removed from the test board, and appropriate testing equipment is utilized to test an electrical parameter of the target device(s) according to a condition specified in the product specifications. A result of the test is recorded. B) Temperature in the test chamber is adjusted to 150° C. The target device(s) are mounted on the test board. The test board is placed in the test chamber, and a maximum negative gate-to-source voltage, which is specified in the product specifications, is applied to the target device(s) on the test board, so as to conduct another test of high temperature annealing under bias for 48 hours. After the 48 hours, the temperature in the test chamber is lowered to room temperature, and the voltage on the target device(s) is removed. The target device(s) are removed from the test board, and appropriate testing equipment is utilized to test an electrical parameter of the target device(s) according to a condition specified in the product specifications. A result of the test is recorded.

A variation $\Delta Vth_{high\ temperature\ annealing}$ of the threshold voltage between high temperature annealing under a positive gate bias and high temperature annealing under a negative gate bias is calculated based on test data obtained in (2) through a following equation.

$$\Delta Vth_{high\ temperature\ annealing} = Vth_{high\ temperature\ annealing\ under\ positive\ gate\ bias} - Vth_{high\ temperature\ annealing\ under\ negative\ gate\ bias}$$

$Vth_{high\ temperature\ annealing\ under\ negative\ gate\ bias}$ and $Vth_{high\ temperature\ annealing\ under\ positive\ gate\ bias}$ are the threshold voltage after the high temperature annealing under the positive gate bias and the threshold voltage after the high temperature annealing under the negative gate bias, respectively.

A criterion for qualifying a post-irradiation threshold voltage is as follows.

$$Vth\min + \Delta Vth_{high\ temperature\ annealing} < Vth < Vth\max - \Delta Vth_{high\ temperature\ annealing}$$

Vthmin and Vthmax are a minimum and a maximum, respectively, of a qualified threshold voltage, which is determined by specifications of the target SiC MOSFET device(s). Vth represents test data to be compared with the criterion.

(3) Irradiation Test of Target Device(s)

The target device(s) are mounted on the test board. Irradiation and bias are applied to the device(s) on the test board according to specifications of a scheme of the irradiation test. The target device(s) is irradiated under a radiation source and a dose rate specified in the scheme, until a target cumulative radiation dose specified in the scheme is reached. Then the device(s) are dismounted, and appropriate testing equipment is utilized to test an electrical parameter of the target device(s) according to a condition specified in the product specifications. A result of the test is recorded.

(4) Post-Irradiation Annealing of Target Device(s)

A) In a case that the electrical parameter after the irradiation exceeds tolerance (that is, test data obtained in step (3) serves as Vth, it is determined whether Vth meets the foregoing criterion, and exceeding tolerance means that Vth does not meet the foregoing criterion), the temperature of the test chamber is adjusted to room temperature. The target device(s) are mounted on the test board, and the maximum positive gate bias specified for the specifications of the target SiC MOSFET device(s) is applied to the device(s) on the test board, so as to conduct a test under room temperature and bias for 168 hours. After the 168 hours, the voltage on the target device(s) is removed, and the target device(s) is dismounted from the test board. Appropriate testing equipment is utilized to test an electrical parameter of the target device(s) according to a condition specified in the product specifications. A result of the test is recorded.

B) In a case that the device(s) is determined to be qualified in the test after the irradiation in (3) or in the test after the room-temperature annealing in (4), the target device(s) are mounted on the test board, and a bias and irradiation are applied to the device(s) on the test board according to specifications of a scheme of the irradiation test. The target device(s) is irradiated under a radiation source and a dose rate specified in the scheme, until 50% of the target cumulative radiation dose specified in the scheme is reached. After the additional test of 50% cumulative total dose is completed, the radiation bias is maintained, and a test under high temperature and bias is conducted at 150° C. for 168 hours. After the 168 h high temperature annealing is completed, the temperature of the test chamber is lowered to room temperature, the voltage on the target device(s) is removed, and the device(s) are dismounted. Appropriate testing equipment is utilized to test an electrical parameter of the target device(s) according to a condition specified in the product specifications. A result of the test is recorded.

(5) Analysis and Processing of Post-Irradiation Test Data of Target Device(s)

The total ionizing dose effect of SiC MOSFETs is complicated. Not only defects generated due to radiation would introduce a change in device performances, but also inherent defects in the device(s) would introduce a change in device performance due to charging or discharging. Conventional manners of irradiation tests developed based on the radiation effect of silicon devices cannot evaluate radiation-introduced degradation of performances of SiC devices with satisfactory accuracy. Herein the pre-irradiation annealing, the irradiation test, the post-irradiation annealing, and the analysis and processing on the test data of the target device(s) are designed according to characteristics of the radiation effect of the SiC MOSFETs, and thereby the anti-radiation capability of the SiC MOSFETs are evaluated based on the test data.

The foregoing criterion for qualifying the post-irradiation threshold voltage is as follows.

$$Vth\min+\Delta Vth_{high\ temperature\ annealing}<Vth<Vth\max-\Delta Vth_{high\ temperature\ annealing}$$

Vthmin and Vthmax are the minimum and the maximum, respectively, of the qualified threshold voltage specified for the specifications of the target SiC MOSFET devices.

The device(s) is determined to pass the test based on total ionizing does, in a case that the threshold voltage of the target device(s) meets the criterion after the irradiation or after post-irradiation room-temperature annealing and meets the criterion after the post-irradiation high-temperature annealing.

The third generation semiconductor SiC devices have advantages of high operating voltage, low power dissipation, high operating temperature, and high operating frequency, and are ideal power electronic devices for space power supply systems. The SiC MOSFETs exhibit the total ionizing dose effect similar to that of the Si MOSFETs. The $SiC/SiO_2$ interface of the SiC MOSFETs is much more complicated than the $Si/SiO_2$ interface of the Si MOSFETs, and the total ionizing dose effect of the former is also more complicated than that of the Si MOSFETs. Therefore, it is necessary to establish an appropriate method for testing SiC MOSFETs based on the total ionizing dose effect. Technical solutions of the present disclosure address the above issue in testing the SiC MOSFETs based on the total ionizing dose, and verify the complicated total ionizing dose effect in the SiC MOSFETs. During the test, the shift of the threshold voltage due to defects induced by a total ionizing dose of radiation and the shift of the threshold voltage due to inherent near-interface traps at the SiC MOSFET interface are measured separately, and the test results are summarized for analysis and calculation. Thereby, a level of the SiC MOSFET devices for withstanding the total ionizing dose effect is evaluated, which can guide a user when applying a design of anti-radiation reinforcement and guide a manufacturer for device improvement.

What is not described in detail herein may belong to the common knowledge of those skilled in the art.

The invention claimed is:

1. A method for testing a SiC MOSFET device based on a total ionizing dose effect, comprising:

acquiring a first threshold voltage of a first SiC MOSFET device in a batch of SiC MOSFET devices through performing first annealing on the first SiC MOSFET device;

calculating a shift criterion based on the first threshold voltage;

irradiating a second SiC MOSFET device in the batch of SiC MOSFET devices until a total ionizing dose of the irradiating reaches a target dose;

acquiring a second threshold voltage of the second SiC MOSFET device after the irradiating;

determining whether the second threshold meets a criterion, wherein the criterion is based on the shift criterion;

in response to the second threshold not meeting the criterion, performing second annealing on the second SiC MOSFET device, acquiring a third threshold voltage of the second SiC MOSFET device after the second annealing;

determining whether the third threshold voltage meets the criterion;

determining that the batch fails a test of the total ionizing dose effect, in response to the second threshold not meeting the criterion and the third threshold voltage not meeting the criterion, and in response to the second threshold meeting the criterion or the third threshold meeting the criterion, performing third annealing on the second SiC MOSFET device, acquiring a fourth threshold voltage of the second SiC MOSFET device after the third annealing, determining whether the fourth threshold voltage meets the criterion;

determining that the batch fails the test of the total ionizing dose effect, in response to the fourth threshold not meeting the criterion, and determining that the batch passes the test of the total ionizing dose effect, in response to the fourth threshold meeting the criterion.

2. The method according to claim 1, wherein the first SiC MOSFET device comprises a group of SiC MOSFET devices, and the second SiC MOSFET device comprises another group of SiC MOSFET devices.

3. The method according to claim 1, further comprising:

acquiring an electrical parameter of each SiC MOSFET device of the batch before performing the first annealing and before the irradiating; and wherein the electrical parameter of the first SiC MOSFET device and the electrical parameter of the second SiC MOSFET device each meets a qualification condition for the electrical parameter.

4. The method according to claim 1, wherein performing the first annealing comprises:

annealing the first SiC MOSFET device under a first temperature while applying a first voltage to the first SiC MOSFET device, and then cooling the first SiC MOSFET device to a second temperature; and annealing the first SiC MOSFET device under a third temperature while applying a second voltage, which is different from the first voltage, to the first SiC MOSFET device, and then cooling the first SiC MOSFET device to a fourth temperature;

wherein the first voltage and the second voltage are determined by specifications of the batch of SiC MOSFET devices.

5. The method according to claim 4, wherein the first temperature and the third temperature each ranges from 100° C. to 200° C.

6. The method according to claim 5, wherein the first temperature and the third temperature each is equal to 150° C.

7. The method according to claim 4, wherein the second temperature and the fourth temperature each is room temperature.

8. The method according to claim 4, wherein:

annealing the first SiC MOSFET device to the first temperature while applying the first voltage to the first SiC MOSFET device lasts for a first period ranging from 24 hours to 168 hours; and annealing the first SiC MOSFET device to the third temperature while applying the second voltage to the first SiC MOSFET device lasts for a second period ranging from 24 hours to 168 hours.

9. The method according to claim 8, wherein the first period and the second period each is equal to 48 hours.

10. The method according to claim 4, wherein:

the criterion is being greater than a third voltage and smaller than a fourth voltage, the third voltage is equal to a minimum, which is of a qualified threshold voltage, plus the shift criterion;

the fourth voltage is equal to a maximum, which is of the qualified threshold voltage, minus the shift criterion; and the minimum and the maximum of the qualified threshold voltage are determined by the specifications of the batch of SiC MOSFET devices.

11. The method according to claim 1, wherein performing the second annealing on the second SiC MOSFET device comprises:

adjusting temperature of the second SiC MOSFET device to room temperature.

12. The method according to claim 1, wherein performing the third annealing on the second SiC MOSFET device comprises:

annealing the second SiC MOSFET device at fifth temperature ranging from 125° C. to 175° C.

13. The method according to claim 12, wherein the fifth temperature is equal to 150° C.

14. The method according to claim 4, wherein the first voltage is a positive voltage, and the second voltage is a negative voltage.

15. The method according to claim 4, wherein the first voltage is a maximum positive gate-to-source voltage, and the second voltage is a maximum negative gate-to-source voltage.

* * * * *